US012727418B2

(12) United States Patent
Shariff et al.

(10) Patent No.: US 12,727,418 B2
(45) Date of Patent: Sep. 1, 2026

(54) PLASMA DICED WAFERS AND METHODS THEREOF

(71) Applicant: UTAC Headquarters Pte. Ltd., Singapore (SG)

(72) Inventors: Dzafir Bin Mohd Shariff, Singapore (SG); Enrique E. Sarile, Jr., Singapore (SG); Jackson Fernandez Rosario, Singapore (SG); Ronnie M. De Villa, Singapore (SG); Chan Loong Neo, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 888 days.

(21) Appl. No.: 18/056,726

(22) Filed: Nov. 18, 2022

(65) Prior Publication Data

US 2023/0154796 A1 May 18, 2023

Related U.S. Application Data

(60) Provisional application No. 63/281,031, filed on Nov. 18, 2021.

(51) Int. Cl.
*H10P 54/00* (2026.01)
*H10W 74/10* (2026.01)

(52) U.S. Cl.
CPC .......... *H10P 54/00* (2026.01); *H10W 74/137* (2026.01)

(58) Field of Classification Search
CPC ...................................................... H01L 21/78
See application file for complete search history.

(56) References Cited

U.S. PATENT DOCUMENTS

2001/0035401 A1* 11/2001 Manor .................. B28D 1/221 219/121.72
2018/0301419 A1* 10/2018 Fanelli ................. H01L 23/544
2018/0308800 A1* 10/2018 Tsai ...................... H01L 21/568
2019/0206676 A1* 7/2019 Mou ................. H01L 21/02063

FOREIGN PATENT DOCUMENTS

TW 201448029 A * 12/2014 ............ H10D 84/01

* cited by examiner

*Primary Examiner* — Mohammad M Choudhry
(74) *Attorney, Agent, or Firm* — Horizon IP Pte. Ltd.

(57) ABSTRACT

Reliable plasma dicing of wafers to singulate it into individual dies is disclosed. Laser processing is employed to form mask openings in a passivation stack of a processed wafer. The patterned passivation stack serves as a plasma dicing mask for plasma dicing the wafer. The sidewalls of the mask openings may be flat or vertical sidewalls. In other cases, the sidewalls of the mask openings are slanted or chamfered sidewalls. The plasma dices the wafer using first and second plasma etch steps. The first plasma etch step etches to form scalloped sidewalls on the first portion of the die and the second plasma step etches to form flat or vertical sidewalls on a second portion of the die. The second portion of the die is the lower portion of the substrate or wafer. This prevents backside notching to improve reliability.

11 Claims, 14 Drawing Sheets

$470_1$
$470_2$
470
450
430
410
480
400

PLASMA DICED WAFERS AND METHODS THEREOF

CROSS-REFERENCE TO RELATED APPLICATION

This application claims the benefit of U.S. Provisional Application Ser. No. 63/281,031, filed on Nov. 18, 2021, which is incorporated by reference in its entirety for all purposes.

FIELD OF THE INVENTION

The present disclosure generally relates to plasma dicing of semiconductor wafers. More specifically, the present disclosure is directed to reliable dies from plasma dicing.

BACKGROUND

In semiconductor processing, a wafer is processed to form a plurality of devices thereon. After the devices are formed, the wafer is diced to separate the devices into individual dies. Conventional techniques for dicing employ the use of a dicing saw. The saw cuts the wafer along the x-direction and the y-direction saw lines, one at a time, to separate the wafer into individual dies. Sawing, however, takes time, which slows down the processing throughput. In addition, mechanical sawing causes vibration when cutting the wafer. The vibration may cause cracks in the dies, such as the back-end dielectric, which may impact yields negatively.

To combat the issues of sawing, plasma dicing has been investigated. Plasma dicing entails mounting a wafer onto a wafer ring and inserting the wafer ring with the wafer into a plasma chamber for etching. Unlike mechanical sawing, the plasma etch process singulates the wafer into individual dies in a single plasma etch step without any vibration issues. This significantly improves throughput as well as avoids reliability issues due to cracking.

The present disclosure is directed to reliable plasma dicing of wafers for singulating it into individual dies.

SUMMARY

Reliable plasma dicing of wafers is disclosed. In one embodiment, the present disclosure is directed to a device. The device includes device opposing top and bottom device surfaces and device sidewall. The device also includes a device substrate with opposing active and inactive substrate surfaces and side substrate surfaces. The inactive substrate surface serves as the bottom device surface. The device also includes a BEOL dielectric having opposing top and bottom BEOL dielectric surfaces and side BEOL surfaces. The device further includes a passivation layer having opposing top and bottom passivation surfaces and side passivation surfaces. The bottom passivation surface is disposed on the top BEOL dielectric surface. The top passivation surface serves as the top device surface. The passivation layer serves as a plasma dicing mask for plasma dicing a wafer with a plurality of devices. The side substrate surfaces, side BEOL surfaces and side passivation surfaces serve as the device sidewalls. The device sidewalls include a first device sidewall portion from the top BEOL surface to an upper portion of the device substrate. The first device sidewall portion is a scalloped device sidewall portion. The device sidewalls also include a second device sidewall portion from a bottom of the upper portion of the device substrate to the bottom substrate surface. The second device sidewall portion is a vertical device sidewall portion.

In another embodiment, a method of forming devices is disclosed. The method includes providing a processed wafer processed with a plurality of devices arranged in rows and columns separated by first and second saw streets in first and second orthogonal directions. The processed wafer includes a wafer having opposing inactive and active wafer surfaces. A BEOL dielectric, which includes opposing top and bottom BEOL dielectric surfaces, has its bottom BEOL surface disposed on the active wafer surface. A passivation layer has its bottom passivation surface disposed on the top BEOL dielectric surface. Laser is used to cut the passivation layer to form passivation openings to expose the top BEOL dielectric surface in kerf regions within the first and second saw streets. A first plasma etch is performed to etch a first portion of the processed wafer in the kerf regions from the top BEOL surface to an upper portion of the wafer. The first plasma etch produces scalloped sidewalls in the kerf regions. A second plasma etch is performed to etch a second portion of the processed wafer in the kerf regions. The second portion includes a remaining portion of the wafer from a bottom of the upper portion of the wafer to the inactive wafer surface to singulate the processed wafer into individual devices. The second plasma etch produces vertical sidewalls in the second portion.

In yet another embodiment, it relates to a device. The device includes a device substrate, a BEOL dielectric disposed on an active substrate surface of the substrate and a passivation layer disposed on a top passivation surface of the passivation layer. The passivation layer serves as a plasma dicing mask for plasma dicing a wafer with a plurality of devices. Device sidewalls are defined by the side substrate surfaces of the substrate, side BEOL surfaces of the BEOL dielectric and side passivation surfaces of the passivation layer. The device sidewalls include a first device sidewall portion from the top BEOL surface to an upper portion of the device substrate. The first device sidewall portion includes a scalloped device sidewall portion with first plasma etched sidewalls, and a second device sidewall portion from a bottom of the upper portion of the device substrate to the bottom substrate surface. The second device sidewall portion includes a vertical device sidewall portion with second plasma etched sidewalls.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, with emphasis instead generally being placed upon illustrating the principles of the invention. In the following description, various embodiments of the present invention are described with reference to the following drawings, in which.

DETAILED DESCRIPTION

Embodiments relate to plasma dicing of wafers into individual dies. The plasma dicing, according to various embodiments, results in reliable plasma diced dies. The present plasma wafer dicing avoids notching on the backside of the wafer or dies, improving process reliability and yields.

Figure 1A:
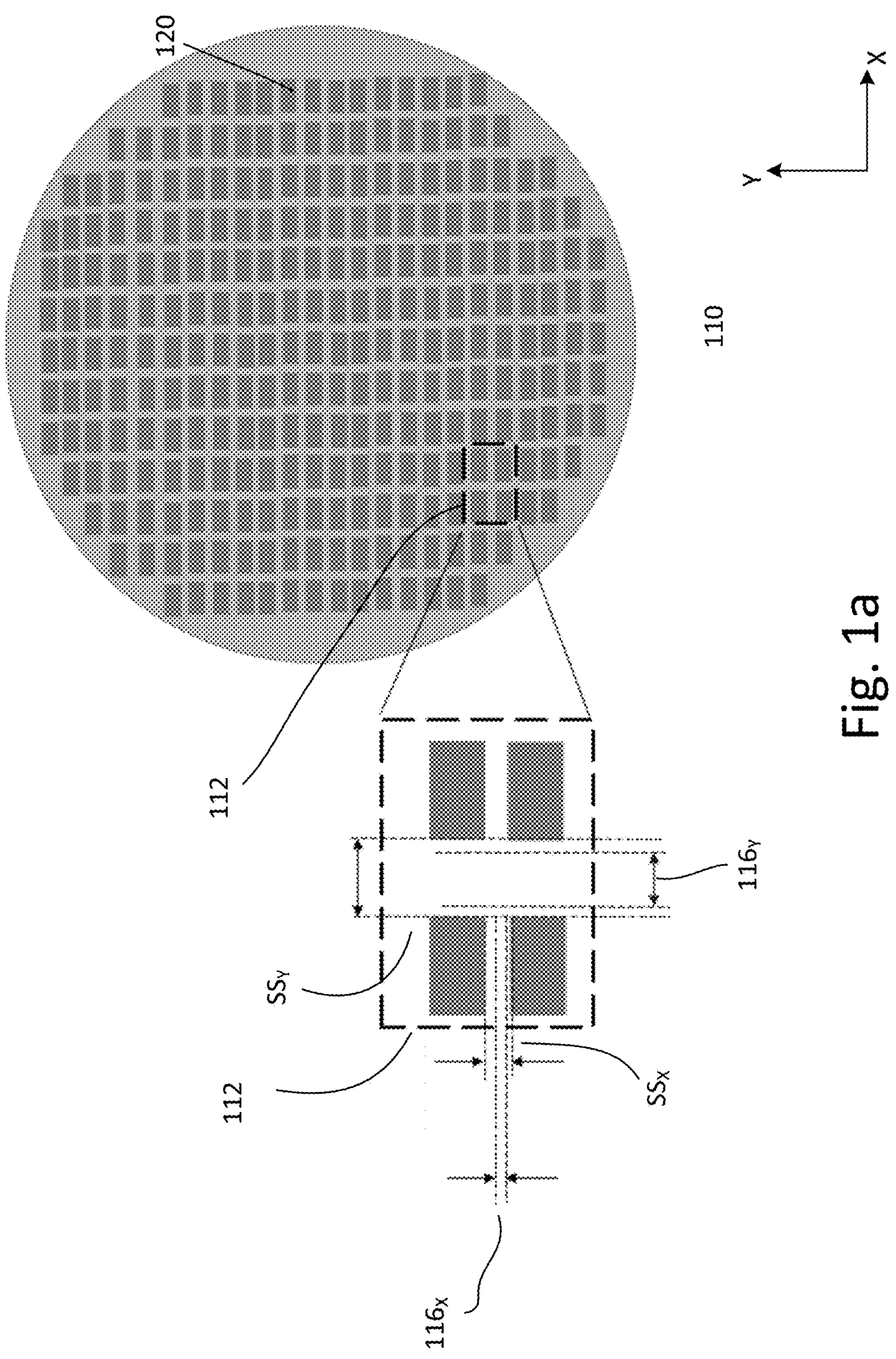
FIG. 1*a* shows a simplified top view of an embodiment of a processed wafer.

FIG. 1a shows a top view of an embodiment of a wafer 110. The wafer, as shown, is a semiconductor wafer with first and second major surfaces. On a first or active (frontside) surface, the wafer is processed to form a plurality of dies 120. The dies, for example, are arranged in rows (x-direction) and columns (y-direction). Separating the rows and columns of dies are first and second saw streets or dicing lines. For example, x-direction dicing line $SS_x$ and y-direction dicing lines $SS_y$ separate the rows and columns of dies on the wafer.

A detailed portion 112 of the wafer which includes adjacent dies in the x-direction and y-direction is shown. As shown, a saw street includes a kerf region within the saw street. For example, an x-direction saw street $SS_x$ includes an x-direction kerf region 116$_x$ disposed within the saw street. Likewise, ay-direction saw street $SS_y$ includes a y-direction kerf region 116y within the saw street. In one embodiment, the kerf region may be about 70 to 80% of the saw street width. Other kerf region widths with respect to the width of the saw street may also be useful.

As shown, the saw streets are defined by the edges of the dies. A kerf region, as shown, is disposed within the saw streets. Typically, test circuitry is disposed within the kerf region for testing the dies on the wafer. During plasma dicing, the kerf region is removed. For example, the gap region between the kerf region and saw street remains after plasma dicing. Other configurations of the saw streets and kerf regions may also be useful.

Figure 1B:
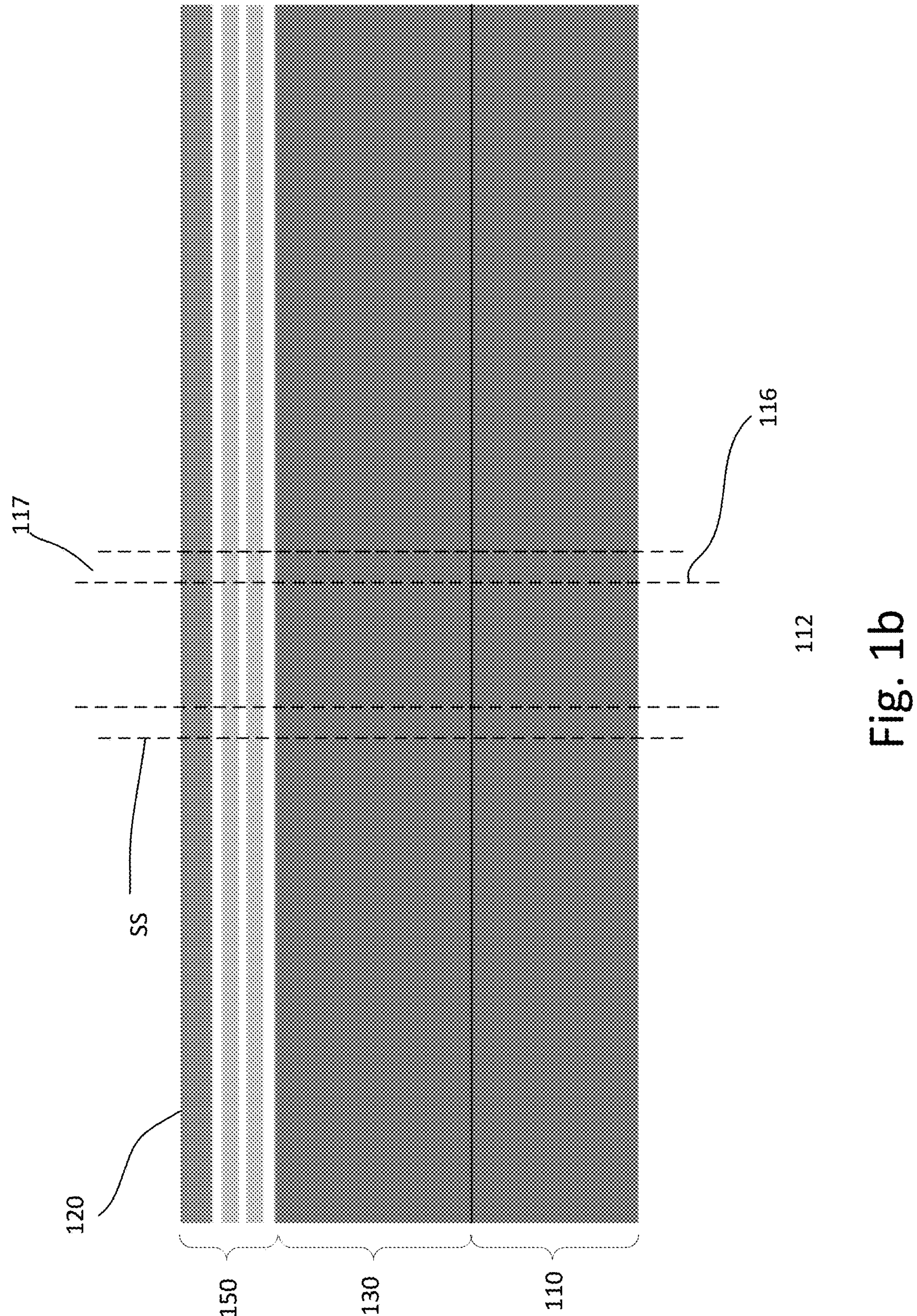
FIG. 1*b* shows a simplified cross-sectional view of a portion of a processed wafer which includes a saw street between two adjacent dies.

FIG. 1b shows a simplified cross-sectional view of a portion of a processed wafer which includes a saw street between two adjacent dies. As shown, a wafer 110 serves as a substrate for processed dies 120. In one embodiment, the wafer is processed to form dies in parallel separated by orthogonal saw streets SS in the x-direction and the y-direction. As shown, between the saw streets is the kerf region 116. Gap regions 117 exist between the saw street and the kerf region.

In general, the fabrication of devices may involve the formation of features on a substrate that makes up circuit components, such as transistors, resistors, capacitors as well as other circuit components. The components are interconnected, enabling the device to perform the desired functions. To form the features and interconnections, layers are repeatedly deposited on the substrate and patterned as desired using lithographic techniques. For example, a wafer is patterned by exposing a photoresist layer with an exposure source using a reticle containing the desired pattern. After exposure, the photoresist layer is developed, transferring the pattern of the reticle to the photoresist layer. This forms a photoresist etch mask. An etch is performed using the etch mask to replicate the pattern on the wafer below, which may include one or more layers, depending on the stage of the process. In the formation of the devices, numerous reticles may be used for different patterning processes.

In one embodiment, features corresponding to the circuit components are formed in, on or above the surface of the wafer. For example, doped regions serving as wells, S/D contacts and well contacts may be formed by ion implantation processes in the substrate while other features, such as gates, capacitors, resistors, isolation regions and other components, may be formed on and above the surface of the substrate.

A back-end-of-line dielectric (BEOL) 130 may be formed on the substrate over the circuit components. The BEOL dielectric layer includes a pre-metal interlayer dielectric (ILD) layer disposed over the circuit components and a plurality of intermetal dielectric (IMD) layers disposed over the pre-metal ILD layer. The number of IMD layers may depend on the CMOS process or technology.

The pre-metal ILD layer includes pre-metal contacts which are connected to contact regions of the components. For example, the pre-metal contacts are connected to S/D regions, transistor gates and well contacts. The pre-metal contacts, for example, may be tungsten (W) contacts. Other types of contacts may also be useful. The pre-metal ILD layer may be formed from multiple dielectric layers. Various dielectric materials, such as silicon oxide ($SiO_2$), may be used to form the pre-metal ILD layer.

As for an IMD layer, it includes a metal dielectric layer below a via dielectric level. The dielectric layers of the IMD layer may be $SiO_2$. Other types of dielectric materials or combinations of dielectric materials or layers may also be useful to form the IMD layer. The metal level includes metal lines and the via level includes via contacts. The uppermost metal level may serve as a pad level in which bond pads for external connections to the dies are disposed. The metal lines and via contacts may be formed using damascene techniques, such as a single or a dual damascene process. In the case of a single damascene process, the contacts and metal lines are formed in separate processes. In the case of a dual damascene process, the metal lines and contacts are formed in the same process. Other configurations of the IMD layers may also be useful.

Above the BEOL dielectric is a passivation stack 150. The passivation stack includes multiple dielectric passivation layers. For example, the passivation layer may include silicon oxide, silicon nitride and/or silicon oxynitride layers. The uppermost layer may be silicon nitride. For example, the uppermost passivation layer can be etched selectively from the BEOL dielectric. Other configurations of the passivation layer or stack may also be useful. The passivation stack protects the die. Bond openings may be formed in the passivation stack to expose the bond pads. Bond openings facilitate interconnecting the die and package substrate during the package assembly process. In one embodiment, the passivation stack is patterned to define openings for plasma dicing of the wafer to singulate it into individual dies. In one embodiment, plasma etch openings correspond to the kerf region within the saw streets. For example, the plasma dicing process removes the kerf regions, leaving the gap regions remaining.

Figure 2A:
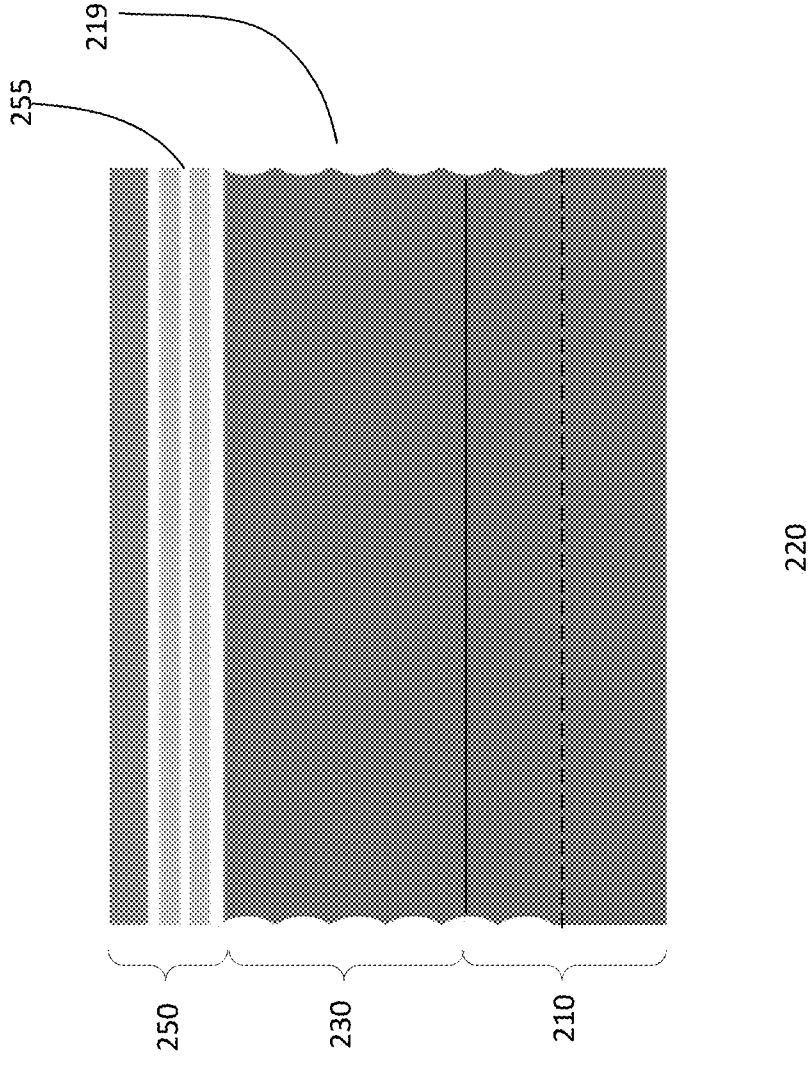
FIGS. 2a-2b show simplified cross-sectional views of embodiments of a plasma diced die after plasma dicing.
Figure 2B:
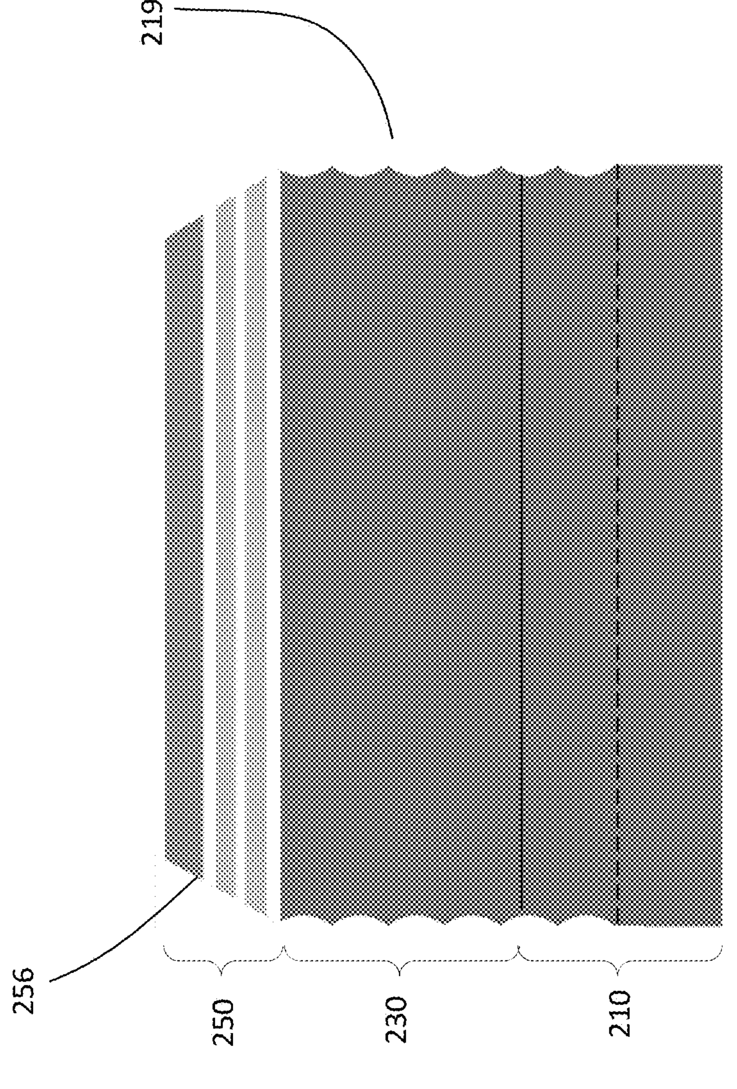

FIGS. 2a-2b show simplified cross-sectional views of embodiments of plasma diced dies after plasma dicing. Referring to FIG. 2a, a simplified cross-section view of an embodiment of a plasma diced die 220 is shown. The cross-section view may be along the x-direction or the y-direction. The die includes a substrate 210 with circuit components. Above the substrate is a BEOL dielectric 230 with interconnections for the circuit components. For example, the BEOL dielectric includes an ILD layer with multiple IMD layers thereover. An uppermost metal level dielectric of the IMD layer may serve as a pad level with bond pads.

A passivation stack 250 is disposed over the top of the BEOL dielectric. For example, the passivation stack is disposed over the pad level with bond pads. In one embodiment, the passivation stack includes multiple dielectric passivation layers. For example, the passivation layer may include silicon oxide, silicon nitride and/or silicon oxynitride layers. Other configurations of passivation stacks may also be useful. The passivation stack may include pad openings (not shown) to expose the bond pads for external connections to the internal circuit components of the die. For example, power and input/output (I/O) connections are provided to the die via the bond pads.

In one embodiment, the passivation stack includes flat sidewalls 255. The flat sidewalls, for example, form planar surfaces. For example, the passivation stack includes 2 pairs of opposing flat sidewalls. In one embodiment, the flat sidewalls are in the vertical direction. For example, the vertical sidewall walls are orthogonal to the major surfaces of the wafer or substrate of the die, such as the top or bottom substrate surface. The vertical sidewalls are formed by the mask opening process to define the plasma dicing mask. In one embodiment, the vertical sidewalls are formed by a single laser beam cutting using a single cut. The single cut, for example, may be effected by a single pass or multiple passes.

As for the BEOL dielectric and an upper portion of the substrate, they include scalloped sidewalls 219. The scalloped sidewalls, for example, result from a plasma process using deposition and etch cycles. For example, each cycle of deposition and etch forms 1 scallop shaped sub-portion. The scalloped shaped sidewalls form a first or an upper portion of the die sidewall profile below the passivation stack. In one embodiment, a second or lower portion of the substrate includes flat sidewalls. For example, the lower portion of the substrate includes flat or vertical sidewalls. The vertical sidewalls result from a uni-directional plasma etch process. The lower portion of the substrate forms a second portion of the die sidewall profile below the passivation stack. In one embodiment, the thickness of the second portion of the die sidewall profile may be about 5%-50% of the thickness of the substrate. Other thicknesses for the second portion, such as 5%-20% of the thickness of the substrate, may also be useful. The flat sidewall profile of the second portion prevents backside notching of the die, improving reliability.

As described, scalloped sidewalls, although not flat, facilitates forming a vertical or substantially vertical die sidewall. For example, the die sidewall below the passivation layer is effectively vertical (about 90° with respect to the horizontal surfaces of the substrate 0.

FIG. 2*b* shows a simplified cross-sectional view of another embodiment of a plasma diced die 220. The die is similar to that shown in FIG. 2*a*. Common elements may not be described or described in detail.

The die includes a substrate 210 with circuit components and a BEOL dielectric 230 thereon. A passivation stack 250 is disposed over the top of the BEOL dielectric. In one embodiment, the passivation stack includes flat sidewalls 256. The flat sidewall surface, for example, forms a planar surface. In one embodiment, the flat sidewalls are chamfered passivation sidewalls 256. For example, the chamfered passivation sidewalls are angled with respect to the first and second major surfaces (e.g., of the wafer of the die. The angle, for example, may be about 50°-60°. Other angles for the chamfered sidewalls may also be useful. The chamfered sidewalls are formed by the mask opening process to define the plasma dicing mask. In one embodiment, the chamfered sidewalls are formed by split-beam laser cutting using multiple cuts. For example, the chamfered sidewalls for formed by laser cutting using 3 cuts. Other numbers of cuts may also be useful. Providing a passivation layer with chamfered sidewalls reduces or prevents cracking of the passivation layer. In addition, the chamfered sidewalls improve plasma dicing since they facilitate the flow of plasma downwards.

As for the BEOL dielectric and an upper portion of the substrate, they include scalloped sidewalls 219. The scalloped shaped sidewalls form a first or upper portion of the die sidewall profile below the passivation stack. In one embodiment, a lower portion of the substrate includes flat sidewalls. For example, the lower portion of the substrate includes flat or vertical sidewalls. The lower portion of the substrate forms a second portion of the die sidewall profile below the passivation stack. The vertical sidewall profile in the lower portion of the substrate prevents backside notching of the die, improving reliability.

Figure 3A:
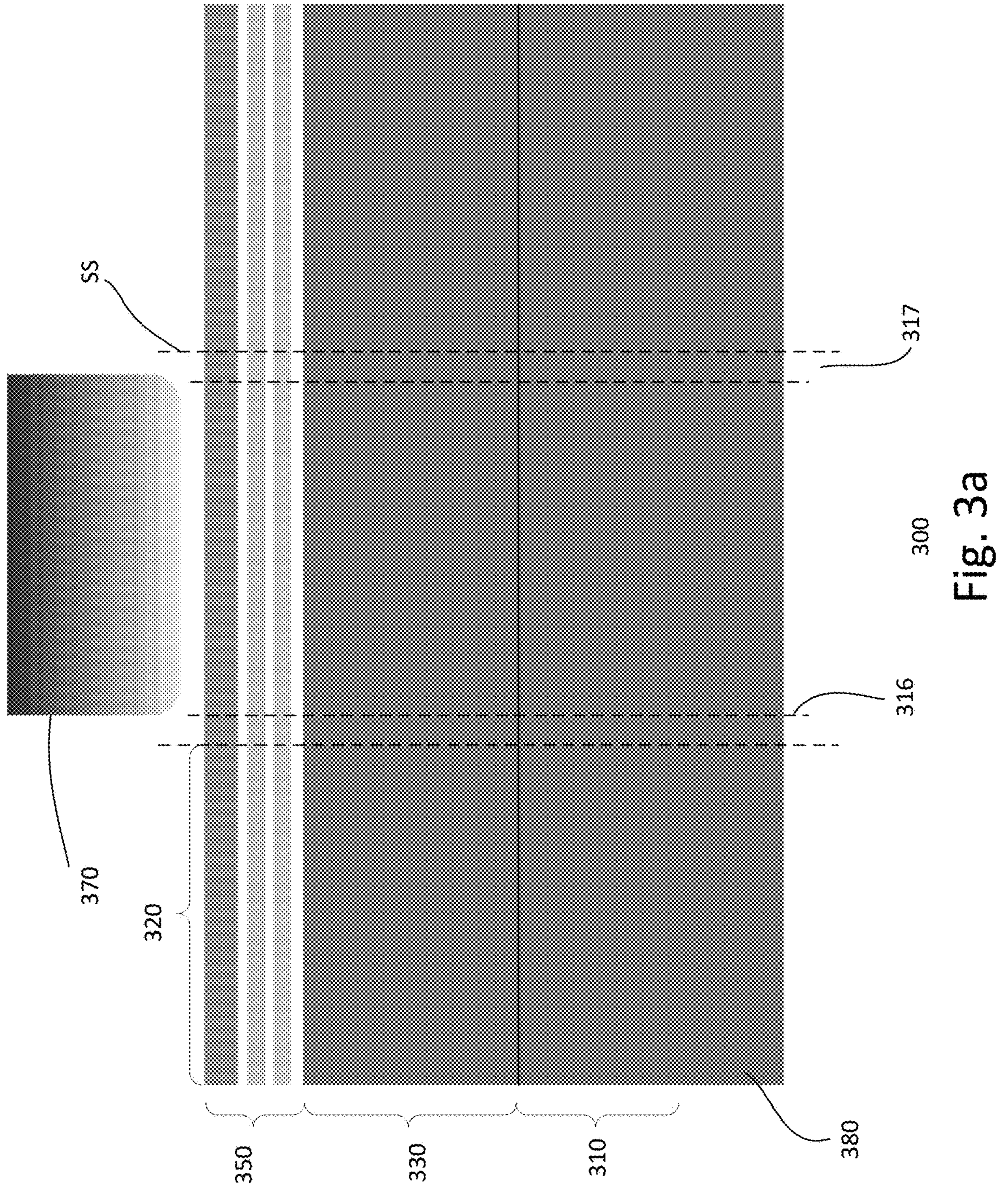
FIGS. 3a-3c show simplified cross-sectional views depicting a process for plasma dicing a wafer.
Figure 3B:
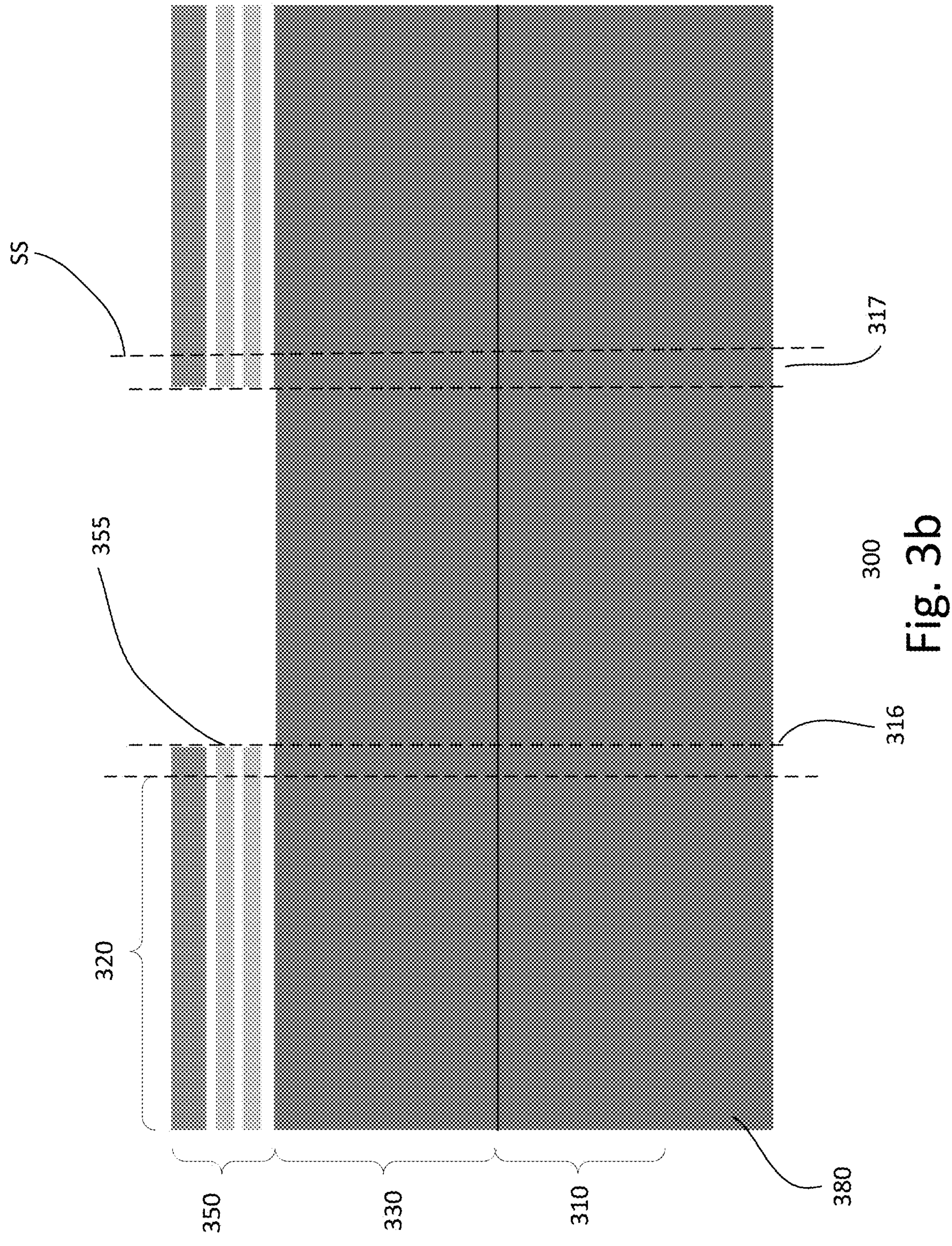
Figure 3C:
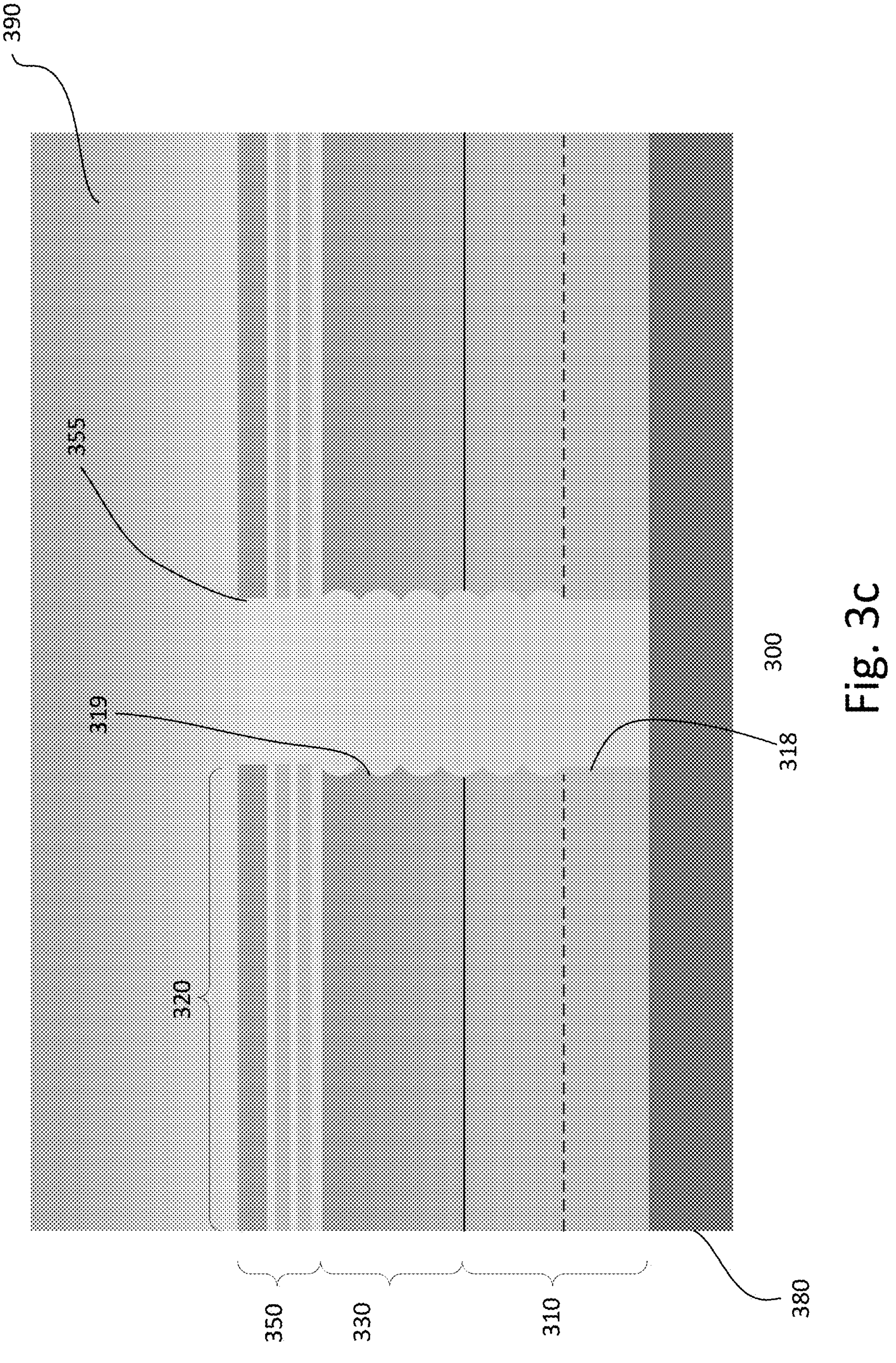

FIGS. 3*a*-3*c* shows simplified cross-sectional views of an embodiment of a process 300 for plasma dicing a processed wafer to singulate it into individual dies 320. Illustratively, a portion of the wafer is shown. The portion of the wafer is similar to that shown in FIG. 1*a* and the dies are similar to the die described in FIG. 2*a*. Common elements may not be described or described in detail.

Referring to FIG. 3*a*, the portion of the processed wafer shown includes two adjacent dies 320 with a saw street SS therebetween and a kerf region 316 therein. Gap regions 317 separate the edges of the SS and kerf region. The processed wafer includes a wafer 310 processed with circuit components, a BEOL dielectric 330 with interconnects over the wafer and a passivation stack 350 on the BEOL dielectric.

In preparation for plasma dicing, the processed wafer is mounted onto an adhesive dicing tape 380. The tape, for example, may be mounted onto a tape frame (not shown). In one embodiment, the wafer is processed to form mask openings defining plasma dicing channels. In one embodiment, the plasma dicing channels correspond to the kerf regions of the wafer. In one embodiment, laser processing is employed to form the mask openings. For example, a laser beam 370 is used to pattern the passivation stack to form mask openings which expose the kerf regions of the wafer. For example, a single laser beam having the desired with of the kerf region is employed. In one embodiment, the laser beam cuts the passivation stack in the x-direction and y-direction to expose the kerf regions one kerf region at a time. For example, each pass of the laser beam forms one cut to expose one kerf region. In some cases, several laser beam passes can also be used to cut one kerf region. For example, multiple passes may be used to form the cut of the kerf region.

In FIG. 3*b*, the laser beam forms openings in the passivation stack to expose the kerf region 316. In one embodiment, the laser beam forms mask openings in the passivation stack with flat sidewalls 355. In one embodiment, the flat sidewalls are vertical sidewalls. The mask opening process is finished when the laser beam cuts the passivation stack so that all kerf regions are exposed. Each kerf region is exposed with one cut of the laser beam. As discussed, a cut can be effected by a single pass or multiple passes of the laser beam. After mask processing is completed, the wafer is transferred to a plasma dicing tool. For example, the wafer is transferred to a plasma chamber of a plasma dicing tool.

As shown in FIG. 3*c*, plasma etching is performed to singulate the processed wafer into individual dies 320. For example, plasma etches the wafer with the patterned passivation stack 350 serving as a dicing mask. For example, plasma 390 flows downwards to dice the wafer. In one embodiment, the plasma etch process includes first and second processes.

In one embodiment, the first etch process forms a first portion of the processed wafer. The first portion of the processed wafer includes the BEOL dielectric 330 and an upper portion of the wafer 310. In one embodiment, the first plasma process employs deposition and etch cycles. The first plasma process forms die sidewalls with scalloped sidewalls 319. As the passivation stack serves as an etch mask, it is unaffected by the plasma. Each cycle of deposition and etch forms 1 scallop shaped sub-portion.

After the first portion of the processed wafer is etched, the second plasma etch commences to form a second portion of the processed wafer. The second portion includes a lower portion of the wafer 310. In one embodiment, the second plasma process is a uni-directional plasma etch process, forming flat sidewalls 318 for the lower portion of wafer 310. In one embodiment, the flat sidewalls are vertical sidewalls. The vertical sidewall profile prevents backside notching of the die, improving reliability.

FIGS. 4*a*-4*d* shows simplified cross-sectional views of another embodiment of a process 400 for plasma dicing a processed wafer to singulate it into individual dies 420. Illustratively, a portion of the processed wafer is shown. The portion of the processed wafer is similar to that shown in FIG. 1*a*, the dies are similar to the die described in FIG. 2*b* and the process is similar to that described in FIGS. 3*a*-3*c*. Common elements may not be described or described in detail.

Figure 4A:
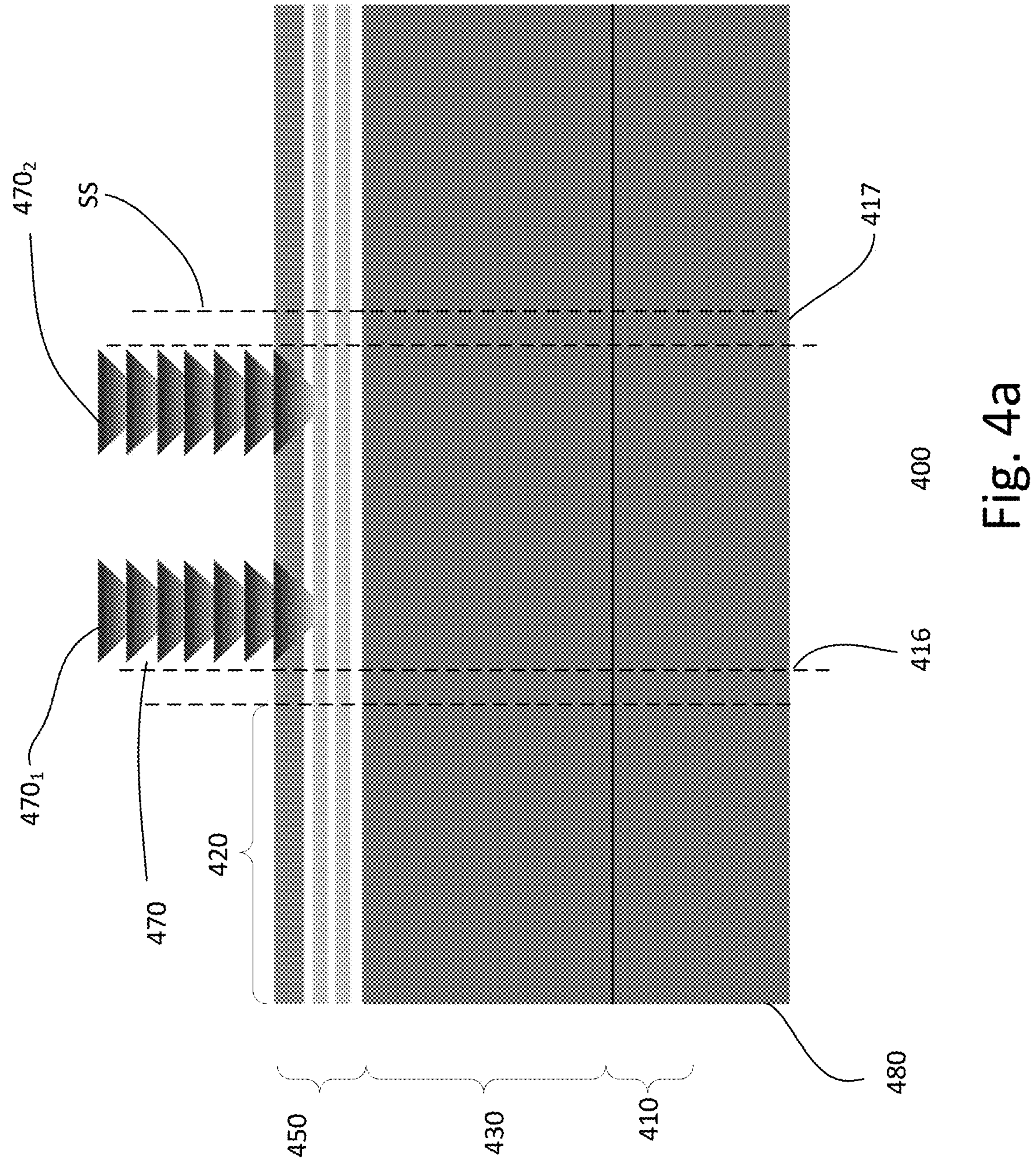
FIGS. 4a-4g show simplified cross-sectional views depicting another process for plasma dicing a wafer.

Referring to FIG. 4*a*, the portion of the processed wafer shown includes two adjacent dies 420 with a saw street SS and a kerf region 416. Gap regions 417 separate the edges of the SS and kerf region. The processed wafer includes a wafer 410 processed with circuit components, a BEOL dielectric 430 with interconnects over the wafer and a passivation stack 450 on the BEOL dielectric. The processed wafer is mounted onto a dicing tape 480. The tape, for example, may be mounted onto a tape frame (not shown).

In one embodiment, the wafer is processed to form mask openings defining plasma dicing channels which, for example, correspond to the kerf regions of the processed wafer. In one embodiment, laser processing is employed to form the mask openings. For example, a laser beam is used to pattern the passivation stack to form mask openings which expose the kerf regions of the wafer. In one embodiment, the laser beam cuts the passivation stack in the x-direction and y-direction to expose the kerf regions one kerf region at a time. For example, each pass of the laser beam forms one cut to expose one kerf region. In some cases, several laser beam passes can also be used to cut one kerf region.

In one embodiment, laser processing includes forming one mask opening (in the x-direction or the y-direction) using multiple passes with a split laser beam 470 to from mask openings having chamfered sidewalls. As shown, a first pass is performed using a split laser beam with first and second beams 4701 and 4702. The beams are configured to form partial openings in the passivation layer. The outer edges of the partial openings correspond to the outer edges of the kerf region. For example, the pitch of the split beams can be configured to be spaced apart so that the outer edges of the first and second partial openings correspond to the outer edges of the kerf region.

Figure 4B:
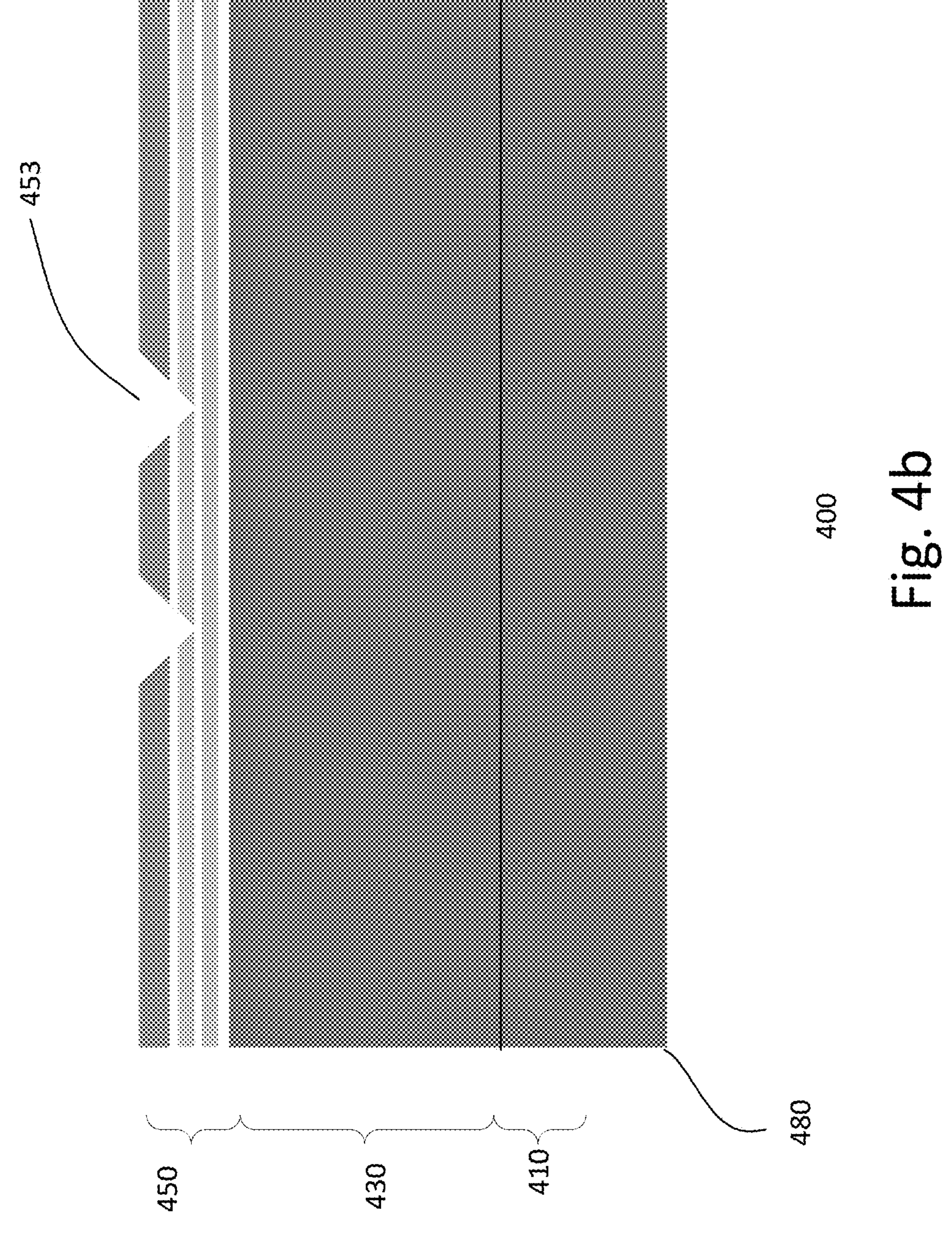

In FIG. 4*b*, the first cut of the laser process using split beams is completed. The first cut forms the first partial openings 453 in the passivation stack 450. In one embodiment, the partial openings are v-shaped openings. The partial openings extend about 5-10 um into the passivation stack. Extending the partial openings by other depths into the passivation layer may also be useful. The depth, for example, may depend on the thickness of the passivation layer.

Figure 4C:
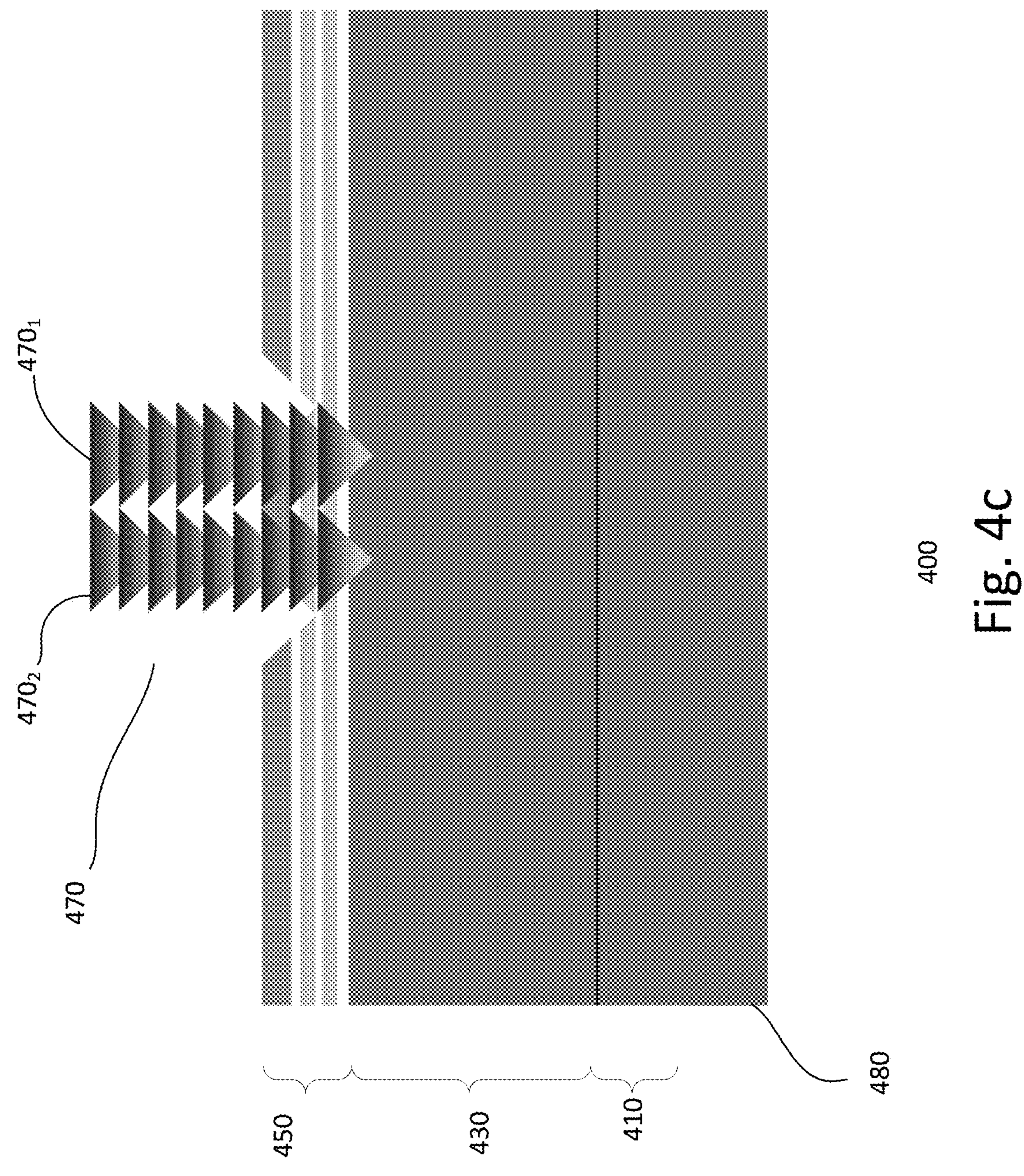

Referring to FIG. 4*c*, a second cut of the laser process using split beams is performed. For example, first and second split beams 4701 and 4702 of the laser beam 470 are employed for the second cut. In one embodiment, the second pass continues etching the partial openings.

Figure 4D:
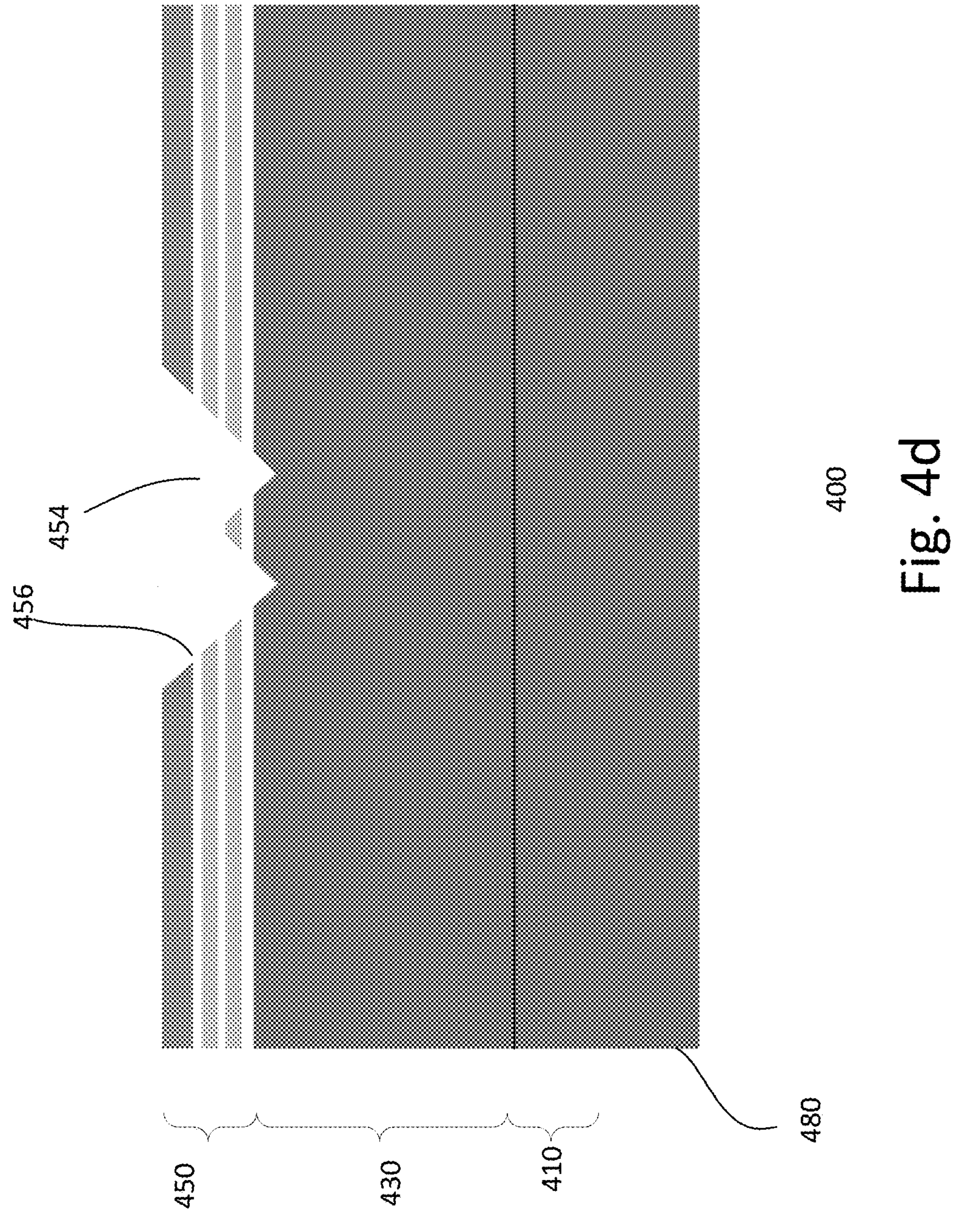

In one embodiment, the split beams are configured with a smaller or narrower pitch to form a W-shaped opening 454, as shown in FIG. 4*d*. In one embodiment, the lower vertices of the W-shaped openings extend into the BEOL dielectric. This ensures that the mask opening exposes the kerf region in the BEOL dielectric. The opening, for example, is about 5-10 um into the BEOL dielectric. Extending the opening by other depths into the BOEL dielectric may also be useful. The W-shaped opening includes chamfered sidewalls 456 for the passivation stack 450. As shown, a notch is disposed between the chamfered sidewalls and extends above the BEOL dielectric.

Figure 4E:
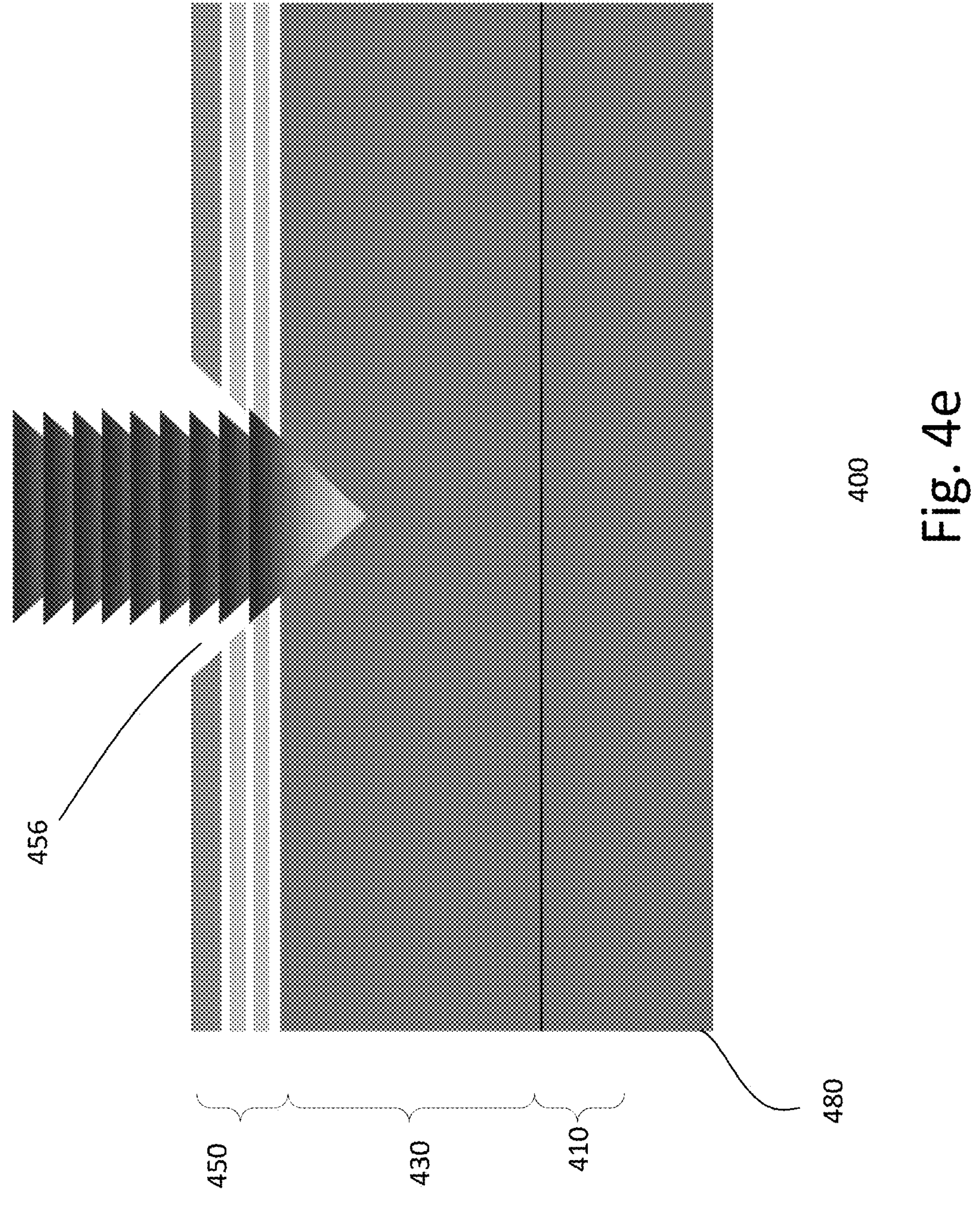

Referring to FIG. 4*e*, a third cut of the laser or mask opening process is performed. The third cut, for example, employs a single beam or merged split beams. For example, the beam is not split like the first and second passes. As such, the unsplit beam is wider than the split beams. The third cut is configured to remove the notch to complete the mask opening process for the kerf region in the x-direction or y-direction.

Figure 4F:
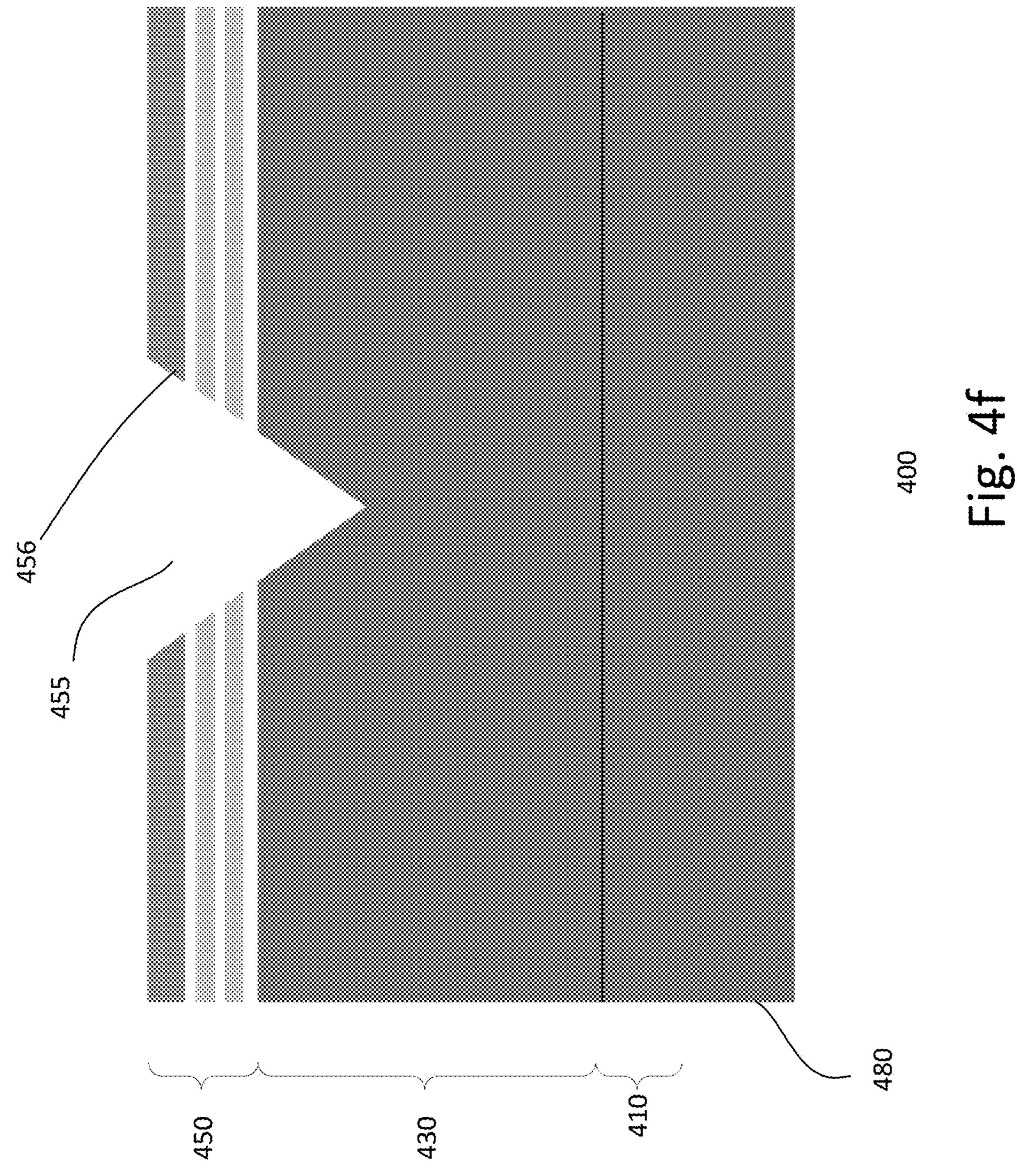

In FIG. 4*f*, the third cut is completed, forming a V-shaped opening 455. The V-shaped opening forms chamfered sidewalls 456 in the passivation stack. The vertex of the V-shaped opening extends into the BEOL dielectric, ensuring complete exposure of the BEOL in the kerf region. The mask opening process is finished when all kerf regions are exposed. After mask processing is completed, the wafer is transferred to a plasma dicing tool. For example, the wafer is transferred to a plasma chamber of a plasma dicing tool.

As described, each mask opening for a kerf region is exposed by a 3 step laser cutting process. Other configurations of processing forming mask openings may also be useful. Also, it is understood that the mask processing may perform the first mask opening process for the whole wafer, followed by the second mask opening process for the whole wafer and finally the third mask opening process for the whole wafer. Other configurations of the mask opening process may also be useful. For example, the process may perform the opening of each kerf region, one kerf region at a time.

Figure 4G:
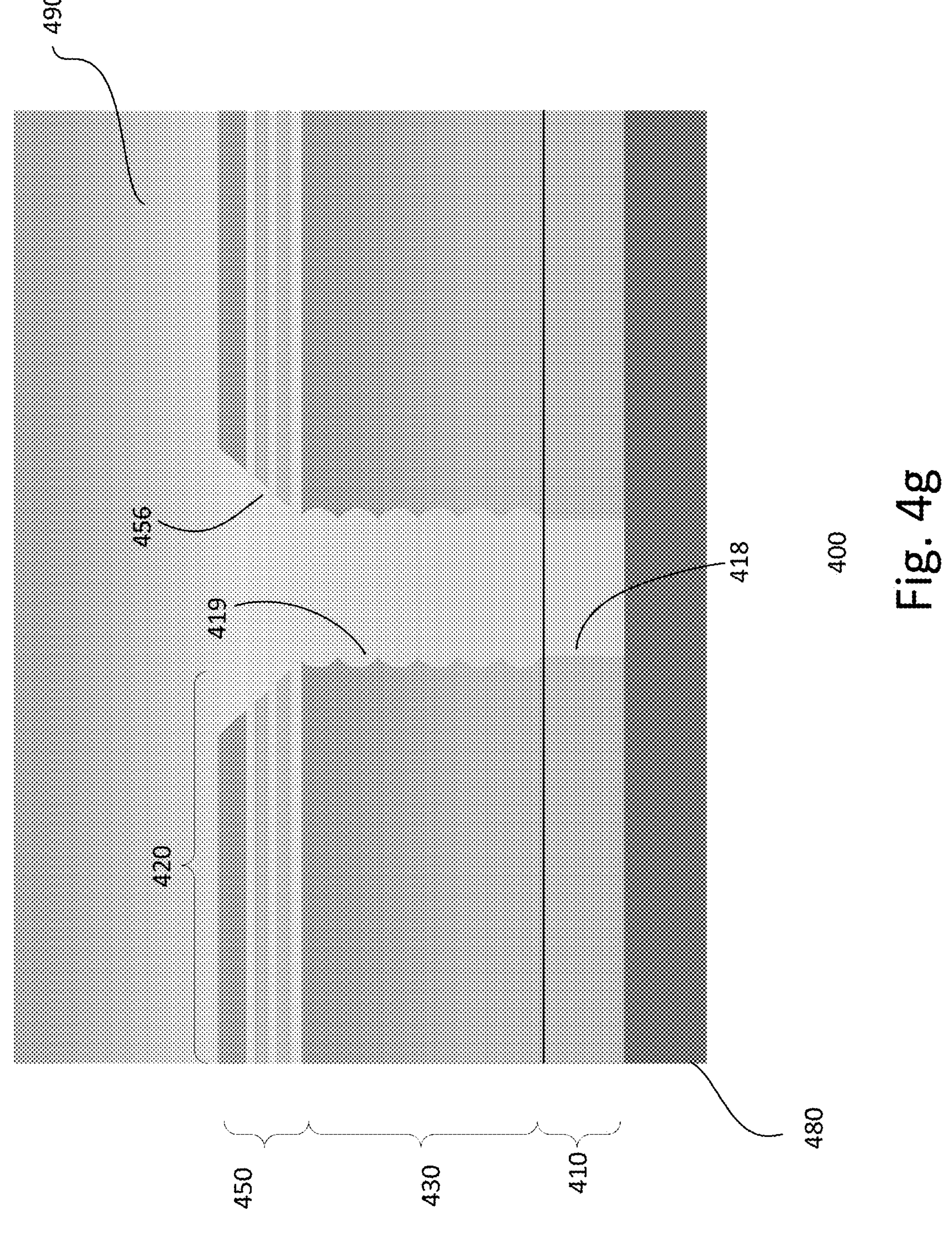

As shown in FIG. 4*g*, plasma etching is performed to singulate the processed wafer into individual dies 420. For example, plasma etches the wafer with the patterned passivation stack 450 serving as a dicing mask. For example, plasma 490 flows downwards to dice the wafer. In one embodiment, the plasma etch process includes first and second processes.

In one embodiment, the first etch process forms a first portion of the wafer. The first portion of the wafer includes the BEOL dielectric 430 and an upper portion of the wafer 410. In one embodiment, the first plasma process employs deposition and etch cycles. The first plasma process forms die sidewalls with scalloped sidewalls. As the passivation stack serves as an etch mask, it is unaffected by the plasma. Each cycle of deposition and etch forms 1 scallop shaped sub-portion.

After the first portion of the wafer is etched, the second plasma etch commences to form a second portion of the wafer. The second portion includes a lower portion of the wafer 410. In one embodiment, the second plasma process is a uni-directional plasma etch process, forming flat sidewalls for the lower portion of wafer 410. In one embodiment, the flat sidewalls are vertical sidewalls. The vertical sidewall profile prevents backside notching of the die, improving reliability.

The present disclosure may be embodied in other specific forms without departing from the spirit or essential characteristics thereof. The foregoing embodiments, therefore, are to be considered in all respects illustrative rather than limiting the invention described herein. The scope of the invention is thus indicated by the appended claims, rather than by the foregoing description, and all changes that come within the meaning and range of equivalency of the claims are intended to be embraced therein.

The invention claimed is:

1. A method of forming devices comprising:
- providing a processed wafer processed with a plurality of devices arranged in rows and columns separated by first and second saw streets in first and second orthogonal directions, wherein the processed wafer includes
  - a wafer having opposing inactive and active wafer surfaces,
  - a BEOL (back-end-of-line) dielectric having opposing top and bottom BEOL dielectric surfaces, wherein the bottom surface is disposed on the active wafer surface,
  - a passivation layer having opposing top and bottom passivation surfaces, wherein the bottom passivation surface is disposed on the top BEOL dielectric surface;
- laser cutting the passivation layer to form passivation openings to expose the top BEOL dielectric surface in kerf regions within the first and second saw streets;
- performing a first plasma etch to etch a first portion of the processed wafer in the kerf regions of the processed wafer after forming the passivation openings, wherein the first plasma etch etches the top BEOL surface and an upper portion of the wafer, wherein the first plasma etch produces scalloped sidewalls in the first portion of the processed wafer in the kerf regions; and
- performing a second plasma etch to etch a second portion of the processed wafer in the kerf regions, the second portion comprises a remaining portion of the wafer from a bottom of the upper portion of the wafer to the inactive wafer surface to singulate the processed wafer into individual devices, wherein the second plasma etch produces vertical sidewalls in the second portion of the processed wafer.

2. The method of claim 1 wherein laser cutting the passivation layer cuts a third portion of the processed wafer, wherein the laser cutting produces vertical passivation sidewalls.

3. The method of claim 1 wherein laser cutting the passivation layer cuts a third portion of the processed wafer, wherein the laser cutting produces chamfered passivation sidewalls.

4. The method of claim 3 wherein an angle of the chamfered passivation sidewalls is about 50°-60°.

5. The method of claim 3 wherein laser cutting to form chamfered passivation sidewalls comprises laser cutting with multiple laser cuts using split laser beams.

6. The method of claim 3 wherein laser cutting to form chamfered passivation sidewalls comprises:
- performing a first laser cut using first split laser beams having a first pitch to partially cut the passivation layer, the first cut forms first and second V-shaped cuts in the kerf regions of the saw streets of the passivation layer, the V-shaped cuts define a width of the kerf regions;
- performing a second laser cut using second split laser beams configured with a second pitch which is narrower than the first pitch to form a W-shaped cut in the passivation layer, wherein lower vertices of the W-shaped cut extend into the BEOL dielectric; and
- performing a third laser cut using merged split beams to cut remaining passivation material in the kerf regions to form a final V-shaped cut defining chamfered passivation sidewalls in the kerf regions.

7. The method of claim 1 wherein the passivation layer comprises a passivation stack having a plurality of dielectric passivation layers.

8. The method of claim 1 wherein the vertical sidewalls of the second portion of the processed wafer prevents backside notching of the wafer of the singulated dies to improve die reliability.

9. The method of claim 6 wherein the first laser cut extends about 5-10 um into the passivation layer.

10. The method of claim 9 wherein the second laser cut extends about 5-10 um into the BEOL dielectric.

11. The method of claim 1 wherein the BEOL dielectric comprises:
- a pre-metal dielectric with pre-metal contacts coupled to device components on the active wafer surface;
- a plurality of intermetal dielectric (IMD) layers, wherein an IMD layer includes
  - a metal level dielectric layer with metal lines, and
  - a via level dielectric layer with via contacts; and
- an uppermost metal level serves as a pad level with bond pads.

* * * * *